(12) United States Patent
Katikaneni

(10) Patent No.: US 6,323,683 B1
(45) Date of Patent: Nov. 27, 2001

(54) LOW DISTORTION LOGIC LEVEL TRANSLATOR

(75) Inventor: Pradeep Katikaneni, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/384,510

(22) Filed: Aug. 27, 1999

(51) Int. Cl.[7] .................................. H03K 19/0175
(52) U.S. Cl. ...................... 326/66; 326/73; 326/77
(58) Field of Search .................. 326/66, 68, 73, 326/77, 81, 83, 31, 34; 327/52, 65, 563, 333

(56) References Cited

U.S. PATENT DOCUMENTS

| | | | |
|---|---|---|---|
| 5,027,014 | 6/1991 | Bass et al. .......................... 307/475 |
| 5,223,753 | * 6/1993 | Lee et al. ............................. 307/494 |
| 5,485,106 | * 1/1996 | Drost et al. ............................ 326/66 |
| 5,621,340 | * 4/1997 | Lee et al. .............................. 327/65 |
| 5,682,108 | 10/1997 | Min ....................................... 326/64 |

* cited by examiner

Primary Examiner—Michael Tokar
Assistant Examiner—Anh Tran
(74) Attorney, Agent, or Firm—Christopher P. Maiorana, P.C.

(57) ABSTRACT

An apparatus comprising a first circuit and a second circuit. The first circuit may be configured to generate a differential intermediate signal in response to a differential input signal. The second circuit may be configured to generate one or more output signals in response to said differential intermediate signal.

18 Claims, 3 Drawing Sheets

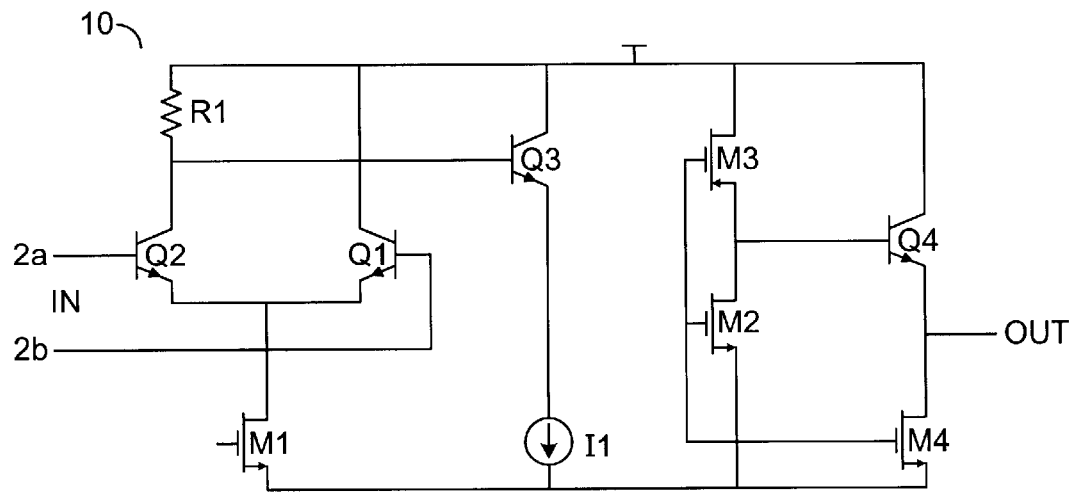
FIG. 1
(CONVENTIONAL)
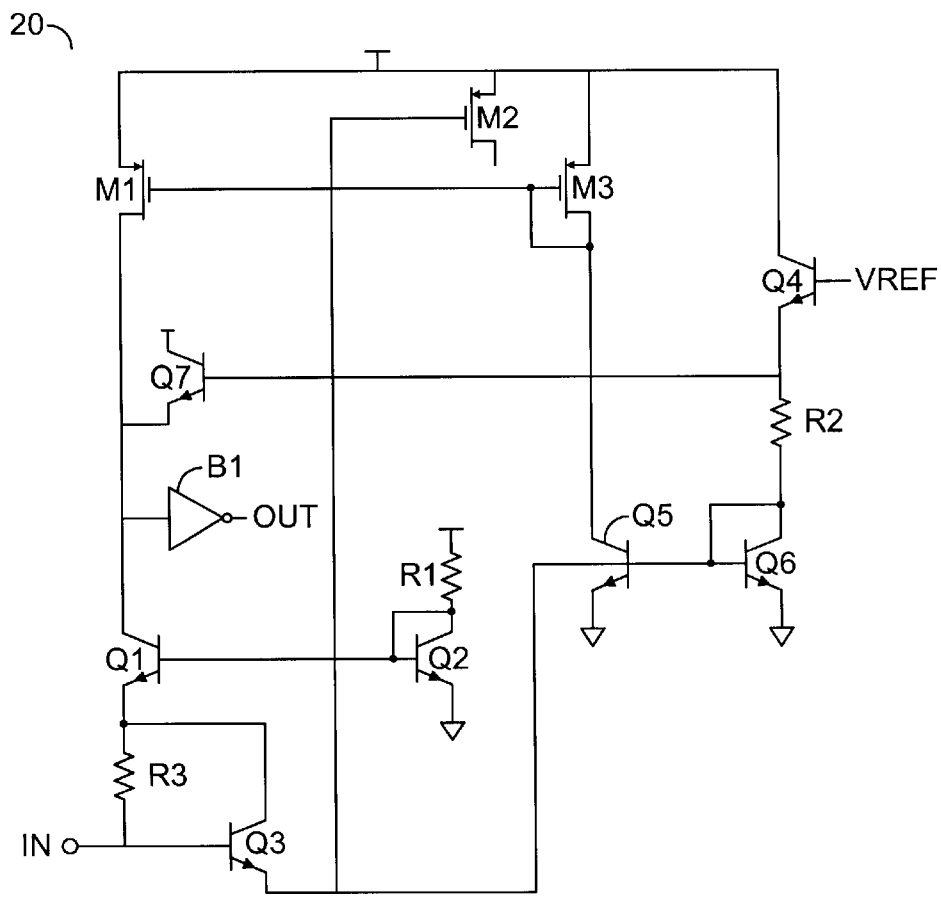
FIG. 2
(CONVENTIONAL)

LOW DISTORTION LOGIC LEVEL TRANSLATOR

FIELD OF THE INVENTION

The present invention relates to logic level translators generally and, more particularly, to a low distortion logic level translator. BACKGROUND OF THE INVENTION Electrical circuits function in many modes having different signal levels. Some of the modes used include RTL, ECL, TTL, and CMOS. A complex circuit or system may be designed so that signals of one mode must be interfaced to circuitry of a different mode. For instance, ECL on-off (1-0) states are represented by negative 0.95 volts and negative 1.71 volts, respectively. CMOS on-off (1-0) states are represented by positive 5 volts and 0 volts, respectively. A logic level translator circuit is used to interface circuitry of different modes.

FIG. 1 is a circuit diagram illustrating a conventional logic level translator 10. The circuit 10 comprises a differential amplifier (i.e., Q1 and Q2) and a BiCMOS inverter (i.e., M2, M3, M4, Q4). A differential input signal is applied at the input terminals 2a and 2b. The transistors Q1 and Q2 amplify the differential input signal and provide a single-ended intermediate signal at the collector of the transistor Q2. The buffer transistor Q3 presents the intermediate signal to the BICMOS inverter. The single ended intermediate signal is inverted and presented at the output as a BiCMOS-level output signal.

FIG. 2 is a circuit diagram illustrating a conventional logic level translator 20. The circuit 20 is used to convert an ECL signal into a CMOS signal. An ECL signal is presented to the base of the transistor Q3. The transistor Q3 acts as a capacitor to couple the signal to the transistors Q5 and Q6. The switching point for the circuit to change state is set by VREF at the base of the transistor Q4. The input signal alters the current flow in the transistor Q5. The current flow in the transistor M3 is likewise changed. The transistors Ml, M3 form a current mirror. Changes in the current flow in the transistor M3 are mirrored in the transistor M1. When sufficient current flows through the transistor M1, the input of the CMOS buffer B1 and the collector of the transistor Q1 are pulled up. The transistor Q7 prevents the transistor Q1 from saturating. When current flow through the transistor M1 drops, the transistor Q1 pulls down the input of the CMOS inverter. The CMOS inverter B1 converts the input levels to CMOS level signals.

The translator 10 immediately converts a differential input signal to a single-ended intermediate signal. Therefore, the translator 10 cannot be used when the differential relationship of the input is to be maintained in the output. The translator 20 likewise can only be used for single-ended signals. The translators 10 and 20 use a combination of bipolar and MOS devices. The bipolar devices must be matched to the MOS devices. Distortion can be large and is process sensitive. The use of bipolar devices hinders uses in purely digital applications.

SUMMARY OF THE INVENTION

The present invention concerns an apparatus comprising a first circuit and a second circuit. The first circuit may be configured to generate a differential intermediate signal in response to a differential input signal. The second circuit may be configured to generate one or more output signals in response to the differential intermediate signal.

The objects, features and advantages of the present invention include providing an apparatus that may (i) be insensitive to process, voltage, and/or temperature, (ii) remain in saturation (i.e., high gain) even when fully switched, (iii) have a very simple output common mode control, (iv) operate with low supply voltages, (v) accept input signals which swing up to the positive supply rail without affecting performance, (vi) use only MOSFET devices, (vii) run at very high speeds with minimal increase in current consumption, and/or (viii) set the output common mode at the threshold of a CMOS inverter.

BRIEF DESCRIPTION OF THE DRAWINGS

These and other objects, features and advantages of the present invention will be apparent from the following detailed description and the appended claims and drawings in which:

FIGS. 1 and 2 are circuit diagrams illustrating conventional level translators;

DETAILED DESCRIPTION OF THE PREFERRED EMBODIMENTS

Figure 3:
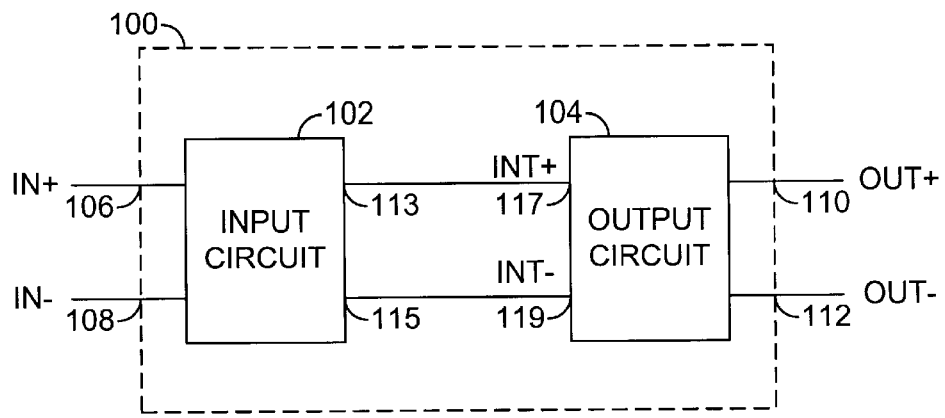
FIG. 3 is a block diagram illustrating a preferred embodiment of the present invention.

Referring to FIG. 3, a block diagram of a circuit 100 is illustrated in accordance with a preferred embodiment of the present invention. In one example, the circuit 100 may be a low distortion logic level translator. The circuit 100 generally comprises a circuit 102 and a circuit 104. The circuit 102 may be implemented as an input circuit. The circuit 104 may be implemented as an output circuit. The circuit 100 generally comprises an input 106 and an input 108. The circuit 100 may be configured to receive a differential input signal at the inputs 106 and 108. The circuit 100 may have one or more outputs. In one example, the circuit 100 may have an output 110, and an output 112.

The circuit 100 may present, in one example, a complementary CMOS output signal at the outputs 110, 112.

Figure 4:
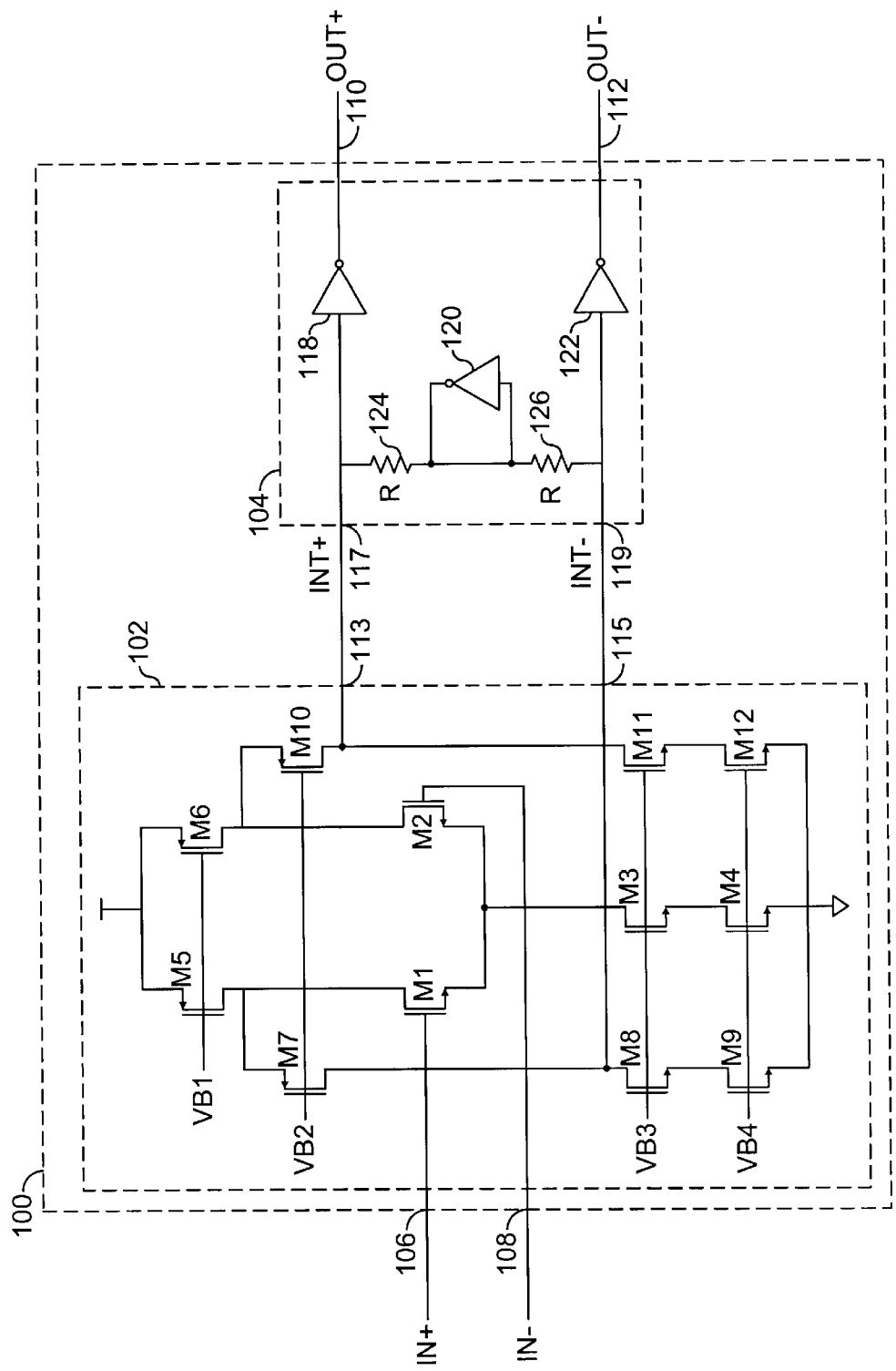
FIG. 4 is a detailed diagram illustrating a preferred embodiment of the present invention.

The input circuit 102 may be configured to generate a differential intermediate signal in response to a differential input signal. The differential input signal may be (i) a differential logic signal, (ii) have a low voltage swing, (iii) be power supply referred, and/or (iv) swing to the positive power supply rail. Referring to FIG. 4, the circuit 102 may be implemented, in one example, as a differential output folded cascode operational amplifier. The input circuit 102 generally comprises a transistor M1, a transistor M2, a transistor M3, a transistor M4, a transistor MS, a transistor M6, a transistor M7, a transistor M8, a transistor M9, a transistor M10, a transistor M11, and a transistor M12. The transistors Ml, M2, M3, M4, MS, M6, M7, M8, M9, M10, Mll, M12 may be implemented as one or more MOSFET transistors. However, other types of transistors may be implemented accordingly to meet the design criteria of a particular implementation.

A gate of the transistor Ml is generally configured to receive a signal (e.g., IN+) from the input 106. A source of the transistor Ml is generally connected to a source of the transistor M2 and a drain of the transistor M3. A drain of the transistor Ml is generally connected to a drain of the transistor MS and a source of the transistor M7.

A gate of the transistor M2 is generally configured to receive a signal (e.g., IN−) from the input 108. A drain of the transistor M2 is generally connected to a drain of the transistor M6 and a source of the transistor M10. A source of the transistor MS is generally connected to a supply voltage. A source of the transistor M6 is generally connected to the supply voltage. A gate of the transistor MS is generally configured to be at a predetermined bias voltage (e.g., VB1). The bias voltage VB1 is generally determined according to the design criteria of a particular implementation. A gate of the transistor M6 is generally configured to be at the bias voltage VB1.

A gate of the transistor M3 is generally configured to be at a predetermined bias voltage (e.g., VB3). The bias voltage VB3 is generally determined according to the design criteria of a particular implementation. A source of the transistor M3 is generally connected to a drain of the transistor M4. A source of the transistor M4 is generally connected to ground. A gate of the transistor M4 is generally configured to be at a predetermined bias voltage (e.g., VB4). The bias voltage VB4 is generally determined according to the design criteria of a particular implementation.

A gate of the transistor M7 is generally configured to be at a predetermined bias voltage (e.g., VB2). The bias voltage VB2 is determined according to the design criteria of a particular implementation. A drain of the transistor M7 is generally connected to a drain of the transistor M8 and the output 115. A source of the transistor M8 is generally connected to a drain of the transistor M9. A source of the transistor M9 is generally connected to ground. A gate of the transistor M8 is generally configured to be at the bias voltage VB3. A gate of the transistor M9 is generally configured to be at the bias voltage VB4.

A gate of the transistor M10 is generally configured to be at the bias voltage VB2. A drain of the transistor M10 is generally connected to a drain of the transistor M11 and the output 113. A gate of the transistor Ml1 is generally configured to be at the bias voltage VB3. A source of the transistor M11 is generally connected to a drain of the transistor M12. A gate of the transistor M12 is generally configured to be at the bias voltage VB4. A source of the transistor M12 is generally connected to ground.

The output circuit 104 may generally comprise an input 117, a gate 118, an input 119, a gate 120, a gate 122, a resistor 124, and a resistor 126. The resistors 124 and 126 generally have the same known resistance value (e.g., R). The resistors 124 and 126 may be implemented as one or more resistors. The resistors 124 and 126 may be implemented as transistors configured as resistors to meet the design criteria of a particular implementation. The gates 118, 120, and 122 may be implemented, in one example, as CMOS inverters. However, other types of gates may be implemented accordingly to meet the design criteria of a particular implementation. The input 117 is generally connected to an input of the gate 118. An output of the gate 118 may generally be connected to the output 110. An output of the gate 120 is generally connected to an input of the gate 120. An input of the gate 122 is generally connected to the input 119. An output of the gate 122 is generally connected to the output 112. The resistor 124 is generally connected between the input of the gate 118 and the output/input of the gate 120. The resistor 126 is generally connected between the input/output of the gate 120 and the input of the gate 122.

A differential input signal is generally applied to the translator 100 at the input terminal 106 and 108. The differential input signal is generally presented to the input circuit 102. The input circuit 102 may be, in one example, a differential output folded cascode operational amplifier. The input circuit 102 generally amplifies the differential input signal IN into a differential intermediate signal (e.g., INT). The signal INT is generally presented at the outputs 113 and 115.

The circuit 104 generally receives the signal INT at the inputs 117 and 119. The circuit 104 generally biases the common mode of the signal INT. The common mode of the signal INT is generally biased using the inverter 120. The output of the inverter 120 is generally connected to the input of inverter 120. Connecting the output of the inverter 120 to the input of the inverter 120 generally forces the inverter 120 to sit at the threshold of the inverter 120. When the differential input signal is zero, the currents through the transistors M7, M8 and M9 are generally equal. Likewise, the currents through the transistors M10, M11 and M12 are generally equal when the differential input signal is zero. In general, no DC bias current is provided by the inverter 120. Since no DC bias current is generally provided by inverter 120, the threshold of inverter 120 is generally not modified.

The current through the transistors MS and M6 is generally the same as the current through the transistors M3 and M4. The current through the transistors M3 and M4 is generally twice the current through M8 and M9 or M11 and M12. The threshold of the inverter 120 will generally not be disturbed. When the circuit 102 is fully switched, since the transistors MS and M6 have the same current as the transistors M3 and M4, half of the current of the transistors M3 and M4 will generally flow through the resistors 124 and 126. When the differential input signal fully switches the circuit 102, no current will generally be supplied by the inverter 120. The polarity of the differential input signal generally determines the direction of the current flow through the resistors 124 and 126. The current flow through the resistors 124 and 126 generally fixes the voltage drop across the resistors 124 and 126. The current flow through the resistors 124 and 126 also generally fixes the swing of the signal INT. Full CMOS levels are generally produced at the outputs 110 and 112 by passing the signal INT through CMOS inverters 118 and 122. Because the output common mode is placed at the inverter threshold, the circuit 104 generates output signals that generally have low distortion relative to the differential input signal.

Figure 5:
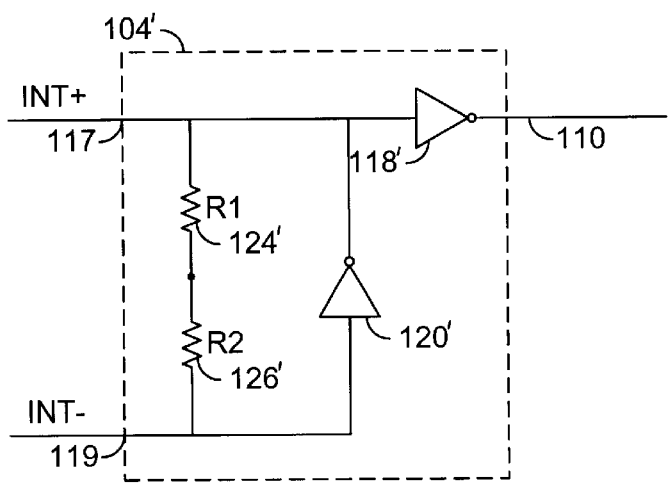
FIG. 5 is a detailed diagram illustrating an alternative embodiment of the present invention.

FIG. 5 is a detailed diagram illustrating an alternative embodiment of an output circuit 104'. The circuit 104'comprises a resistor 124', a resistor 126', an inverter 118', an inverter 120', an input 117, an input 119, and an output 110. The resistor 124' comprises a first and a second terminal. The resistor 126'comprises a first and a second terminal. The resistors 124'and 126' generally have the known resistance values R1 and R2, respectively. The first terminal of the resistor 124' is generally connect to the input 117. The second terminal of the resistor 124' is generally connected to the first terminal of resistor 126'. The second terminal of the resistor 126' is generally connected to the input 119. An input of the inverter 120' is generally connected to the input 119. An output of the inverter 120' is generally connected to the input 117. An input of the inverter 118'is generally connected to the input 117 . An output of the inverter 118' is generally connected to the output 110. The circuit 104' may present a single-ended CMOS output signal in response to the signal INT.

Figure 6:
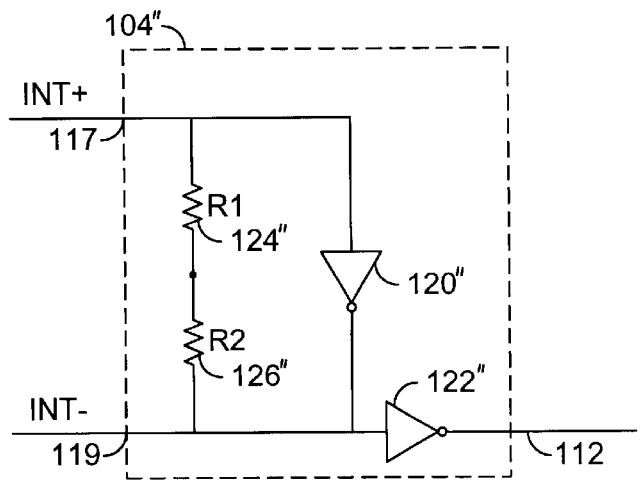
FIG. 6 is a detailed diagram illustrating another alternative embodiment of the present invention.

FIG. 6 is a detailed diagram illustrating another alternative embodiment of a circuit 104". The circuit 104" generally comprises a resistor 124", a resistor 126", an inverter 122", an inverter 120", an input 117", an input 119", and an output 110. The resistors 124" comprises a first and a second terminal. The resistor 126" comprises a first and a second terminal. The resistors 124" and 126" generally have the known resistance values R1 and R2, respectively. The first terminal of the resistor 124" is generally connected to the input 117. The second terminal of the resistor 124" is generally connected to the first terminal of resistor 126". The second terminal of the resistor 126" is generally connected to the input 119. An input of the inverter 120" is generally connected to the input 117. An output of the inverter 120" is generally connected to the input 119. An input of the inverter 122" is generally connected to the input 119. An output of the inverter 122" is generally connected to the output 112. The circuit 104" may present a single-ended CMOS output signal in response to the signal INT.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit comprising a differential input stage coupled to a common gate differential amplifier stage configured to generate a differential intermediate signal in response to a differential input signal; and
    a second circuit configured to generate one or more output signals in response to said differential intermediate signal.
2. The apparatus according to claim 1, wherein said one or more output signals comprise a complementary CMOS output signal.
3. The apparatus according to claim 1, wherein said one or more output signals comprises a single-ended CMOS signal.
4. The apparatus according to claim 1, wherein said one or more output signals comprise CMOS levels.
5. The apparatus according to claim 1, wherein said differential input signals comprises a differential logic signal.
6. The apparatus according to claim 5, wherein said differential input signal further comprises a low voltage swing.
7. The apparatus according to claim 6, wherein said one or more output signals comprise CMOS level signals.
8. The apparatus according to claim 1, wherein said differential input signal swings to the positive supply rail.
9. The apparatus according to claim 1, wherein an output common mode is biased at a threshold of a CMOS inverter.
10. The apparatus according to claim 1, wherein said apparatus comprises a logic level translator.
11. The apparatus according to claim 1, wherein said apparatus comprises a low distortion logic level translator.
12. The apparatus according to claim 1, wherein said first circuit comprises a differential output folded cascode operational amplifier.
13. An apparatus comprising:
    means for generating a differential intermediate signal in response to a differential input signal, said means comprising a differential input stage coupled to a common gate differential amplifier stage; and
    means for generating one or more output signals in response to said differential intermediate signal voltage of an inverter.
14. A method of translating a differential input signal into one or more output signals, comprising the steps of:
    (A) generating a differential intermediate signal in response to a differential input signal;
    (B) coupling a common gate differential amplifier between said differential input signal and said differential intermediate signal; and
    (C) generating one or more output signals in response to said differential intermediate signal.
15. The method according to claim 14, wherein step (A) further comprises the sub steps of:
    (A-1) receiving a differential input signal; and
    (A-2) applying said differential input signal to a differential output folded cascode operational amplifier.
16. The method according to claim 14, wherein step (C) further comprises the sub-steps of:
    (C-1) biasing said common mode of the output signal at the threshold of a CMOS inverter by having an output of said inverter connected to an input of said inverter; and
    (C-2) presenting said differential intermediate signals to one or more inverters to generate CMOS level signals.
17. The method according to claim 14, wherein step (C) comprises the sub-steps of:
    (C-1) applying a resistance between an input of a first CMOS inverter and an output of said first CMOS inverter;
    (C-2) applying said differential intermediate signal across said resistance; and
    (C-3) applying the signal at the output of said first CMOS inverter to an input of a second CMOS inverter.
18. The apparatus according to claim 1, wherein said first circuit is further responsive to one or more bias voltages.

* * * * *